(12) United States Patent
Takahashi

(10) Patent No.: US 12,456,929 B2
(45) Date of Patent: Oct. 28, 2025

(54) POWER CONVERSION DEVICE

(71) Applicant: Mitsubishi Electric Corporation, Tokyo (JP)

(72) Inventor: Hajime Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 337 days.

(21) Appl. No.: 18/159,422

(22) Filed: Jan. 25, 2023

(65) Prior Publication Data

US 2023/0336091 A1   Oct. 19, 2023

(30) Foreign Application Priority Data

Apr. 19, 2022   (JP) .................................. 2022-068652

(51) Int. Cl.
*H02M 7/5387*   (2007.01)
*H02M 7/00*   (2006.01)
*H02M 7/537*   (2006.01)
*H05K 7/20*   (2006.01)

(52) U.S. Cl.
CPC ........... *H02M 7/003* (2013.01); *H02M 7/537* (2013.01); *H02M 7/5387* (2013.01); *H05K 7/209* (2013.01)

(58) Field of Classification Search
CPC ...... H02M 7/003; H02M 7/217; H02M 7/537; H02M 7/5387; H01G 4/33; H05K 7/209
See application file for complete search history.

(56) References Cited

U.S. PATENT DOCUMENTS

| | | | | |
|---|---|---|---|---|
| 6,327,165 | B1 * | 12/2001 | Yamane | H02M 7/003 363/58 |
| 9,184,670 | B2 * | 11/2015 | Matsuno | H02M 7/003 |
| 11,290,025 | B2 * | 3/2022 | Aoyagi | H02M 7/003 |
| 2002/0158329 | A1 * | 10/2002 | Kimura | H01L 25/11 257/703 |

(Continued)

FOREIGN PATENT DOCUMENTS

| | | |
|---|---|---|
| JP | 2010-183763 A | 8/2010 |
| JP | 2011-19395 A | 1/2011 |

(Continued)

OTHER PUBLICATIONS

Japanese Office Action dated May 23, 2023 in Japanese Application No. 2022-068652.

(Continued)

*Primary Examiner* — Gary L Laxton
(74) *Attorney, Agent, or Firm* — Sughrue Mion, PLLC

(57) ABSTRACT

The power conversion device includes: a power module; a plurality of capacitor elements each having an element body portion, a first electrode, and a second electrode; a first busbar connecting the first electrode and the power module; and a second busbar connecting the second electrode and the power module. The power module is disposed so as to be opposed to a side surface of the element body portion of only one of the capacitor elements. One or each of the first busbar and the second busbar has, as a connection member connecting the power module and a corresponding one of the first electrode or the second electrode to each other, an opposed plate-shape portion opposed only to an opposed portion of the side surface of the element body portion opposed to the power module.

16 Claims, 14 Drawing Sheets

(56) References Cited

U.S. PATENT DOCUMENTS

| | | | |
|---|---|---|---|
| 2009/0290398 A1* | 11/2009 | Kanie | H05K 7/14329 363/132 |
| 2010/0026090 A1 | 2/2010 | Nakatsu et al. | |
| 2012/0200164 A1 | 8/2012 | Nakatsu et al. | |
| 2020/0221611 A1 | 7/2020 | Kobayashi et al. | |
| 2020/0359533 A1* | 11/2020 | Iwakiri | H05K 7/209 |

FOREIGN PATENT DOCUMENTS

| | | |
|---|---|---|
| JP | 2011-239679 A | 11/2011 |
| JP | 2020-088064 A | 6/2020 |
| WO | 2017/199304 A1 | 11/2017 |
| WO | 2019/106792 A1 | 6/2019 |

OTHER PUBLICATIONS

Office Action issued Aug. 1, 2023 in Japanese Application No. 2022-068652.

* cited by examiner

POWER CONVERSION DEVICE

BACKGROUND

The present disclosure relates to a power conversion device.

A power conversion device for an electric powertrain is mounted in an electrically-driven vehicle in which a motor is used as a drive source as in an electric automobile or a hybrid automobile. Examples of the power conversion device include: a charger for converting commercial AC power into DC power and charging a high-voltage battery therewith; a DC/DC converter for converting DC power of a high-voltage battery into a voltage (for example, 12 V) of a battery for an auxiliary device; and an inverter for converting DC power from a battery into AC power for a motor.

The power conversion device includes: a smoothing capacitor for smoothing power; and a power module having a leg composed of upper and lower arms which are formed by semiconductor elements such as IGBTs or MOSFETs. In general, a film capacitor having a high rated voltage and excellent durability is used as the smoothing capacitor. However, the film capacitor has a low capacitance per unit volume, and thus, by forming a smoothing capacitor from a plurality of capacitor elements, a necessary capacitance is ensured for the smoothing capacitor.

The capacitor elements and the semiconductor elements are connected to each other with a busbar. The busbar has a path inductance. If the path inductance is high, surge voltage might exceed the withstand voltage of any of the semiconductor elements, resulting in fracture of the semiconductor element. In order to avoid this fracture, it is necessary to use expensive semiconductor elements having high withstand voltages and to decrease the switching speeds of the semiconductor elements. Consequently, problems arise in that: cost for the device increases; and losses in the semiconductor elements increase. In particular, if the losses in the semiconductor elements increase, the temperatures of the semiconductor elements rise and exceed allowable temperatures of the semiconductor elements. Consequently, the semiconductor elements, a sealing material therearound, and the like are fractured. Thus, a cooler having excellent cooling performance needs to be mounted to the power conversion device in order to suppress rise in the temperatures of the semiconductor elements.

For such a cooler, an expensive material having excellent thermal conductivity is used, and thus cost for the power conversion device increases. If such an expensive material is not used, the cooler needs to be upsized so as to ensure cooling performance thereof. Consequently, problems arise in that: cost for the power conversion device increases; and the power conversion device is upsized. It is indispensable to decrease the path inductance in order to solve these problems, i.e., in order to downsize the power conversion device and decrease cost therefor. Conventionally, as methods for decreasing path inductances, a method in which the lengths of paths are shortened and a method in which busbars are disposed with the directions of currents in the busbars being opposite to each other and influence of mutual inductance is inflicted on paths so as to decrease self-inductances have been employed. A configuration in which the path inductance of a connection portion between a smoothing capacitor and a semiconductor element is decreased by utilizing mutual inductance has been disclosed (see, for example, Patent Document 1).

In the configuration disclosed in Patent Document 1, adjacent smoothing capacitor elements compose a pair, and busbars connected to these elements are disposed between the elements so as to form parallel flat-plates. Current flows in opposite directions through the busbars disposed so as to form parallel flat-plates, and thus path inductances can be decreased.

Patent Document 1: Japanese Laid-Open Patent Publication No. 2020-88064

In the above Patent Document 1, since the busbars are disposed so as to form parallel flat-plates, the path inductances can be decreased. However, since a configuration in which the busbars are disposed between the adjacent capacitor elements is employed to effectively realize the busbars in the forms of parallel flat-plates, heat of the busbars is transmitted to the capacitor elements. In order to avoid this transmission, a cooling mechanism for the busbars and the capacitor elements needs to be further provided, whereby a problem arises in that the power conversion device is upsized. In addition, the shapes of the busbars forming parallel flat-plates are complicated, and thus a problem arises in that machining cost for the busbars is high, resulting in increased cost for the power conversion device.

SUMMARY

Considering this, an object of the present disclosure is to provide a power conversion device that has a small size and requires low cost while a path inductance in the power conversion device is decreased.

A power conversion device according to the present disclosure includes: a power module; a plurality of capacitor elements each having an element body portion, a first electrode provided on a first surface of the element body portion, and a second electrode provided on a second surface of the element body portion on an opposite side to the first surface; a first busbar connecting the first electrode of each of the plurality of capacitor elements and the power module to each other; and a second busbar connecting the second electrode of each of the plurality of capacitor elements and the power module to each other, wherein the power module is disposed so as to be opposed to a side surface of the element body portion of only one of the capacitor elements, and one or each of the first busbar and the second busbar has, as a connection member connecting the power module and a corresponding one of the first electrode or the second electrode to each other, an opposed plate-shape portion opposed only to an opposed portion of the side surface of the element body portion opposed to the power module.

In the power conversion device according to the present disclosure, the power module is disposed so as to be opposed to the side surface of the element body portion of only one of the capacitor elements, and one or each of the first busbar and the second busbar has, as a connection member connecting the power module and the corresponding one of the first electrode or the second electrode to each other, the opposed plate-shape portion opposed only to the opposed portion of the side surface of the element body portion opposed to the power module. Consequently, influence of a mutual inductance on the busbar having the opposed plate-shape portion becomes even, and current flows evenly inside the busbar having the opposed plate-shape portion. Thus, the self-inductance of the busbar having the opposed plate-shape portion is decreased, whereby the path inductance of the busbar having the opposed plate-shape portion can be decreased. The opposed plate-shape portion can easily be formed by bending the busbar, a portion of which is to be formed as the opposed plate-shape portion. Therefore, cost for the power conversion device can be decreased. Since evenness is attained in the current path and a loss in the busbar having the opposed plate-shape portion is decreased, it is unnecessary to provide any additional cooling structure for cooling the busbar. Therefore, the power conversion device can be downsized.

DETAILED DESCRIPTION OF THE EMBODIMENTS

Figure 1:
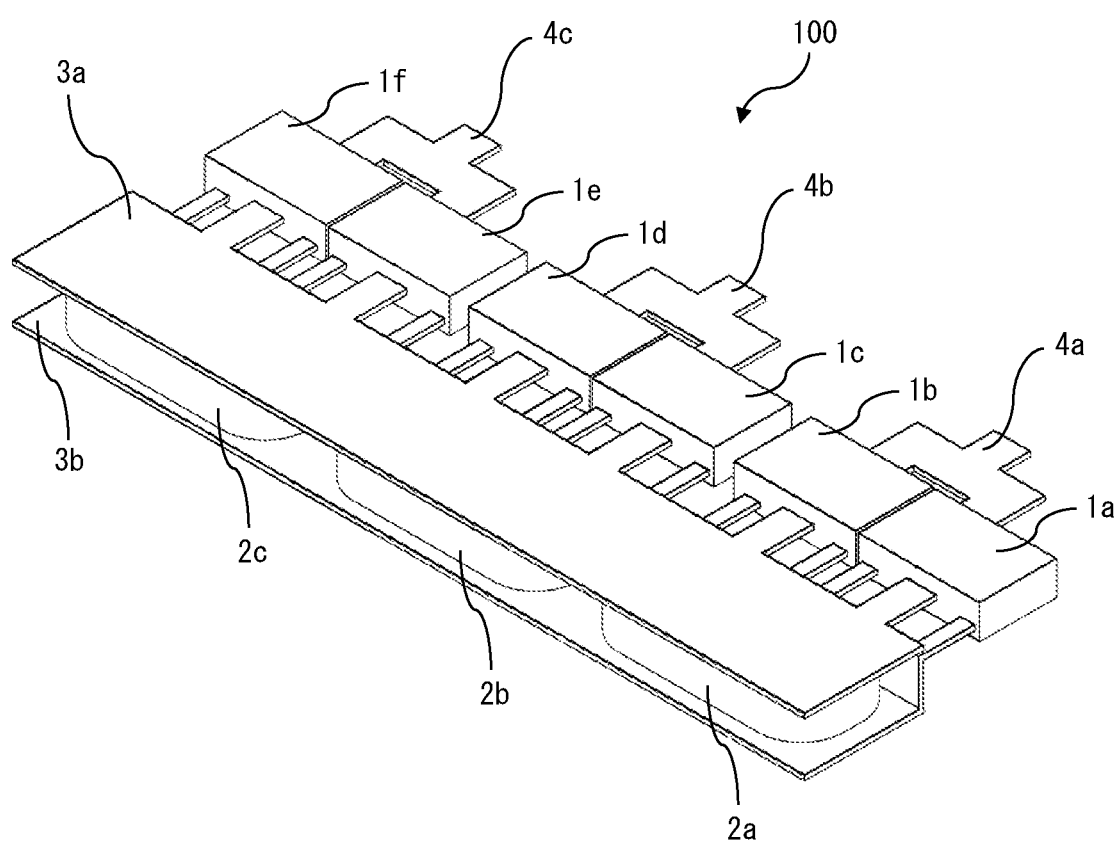
FIG. 1 is a schematic perspective view of a power conversion device according to a first embodiment.

Hereinafter, a power conversion device according to an embodiment of the present disclosure will be described with reference to the drawings. Description will be given while the same or corresponding members and parts in the drawings are denoted by the same reference characters.

First Embodiment

Figure 2:
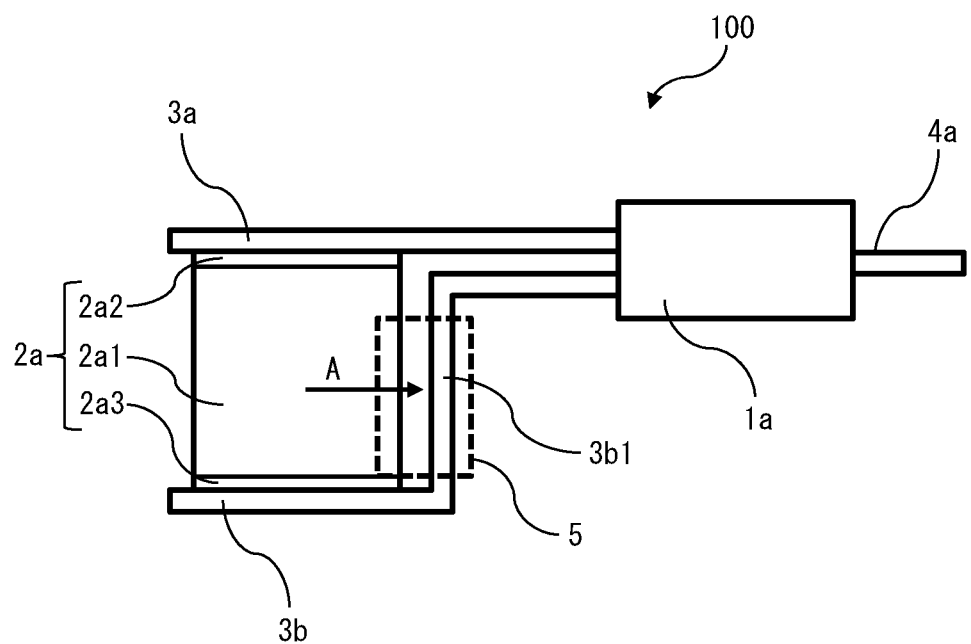
FIG. 2 is a schematic side view of the power conversion device according to the first embodiment.
Figure 3:
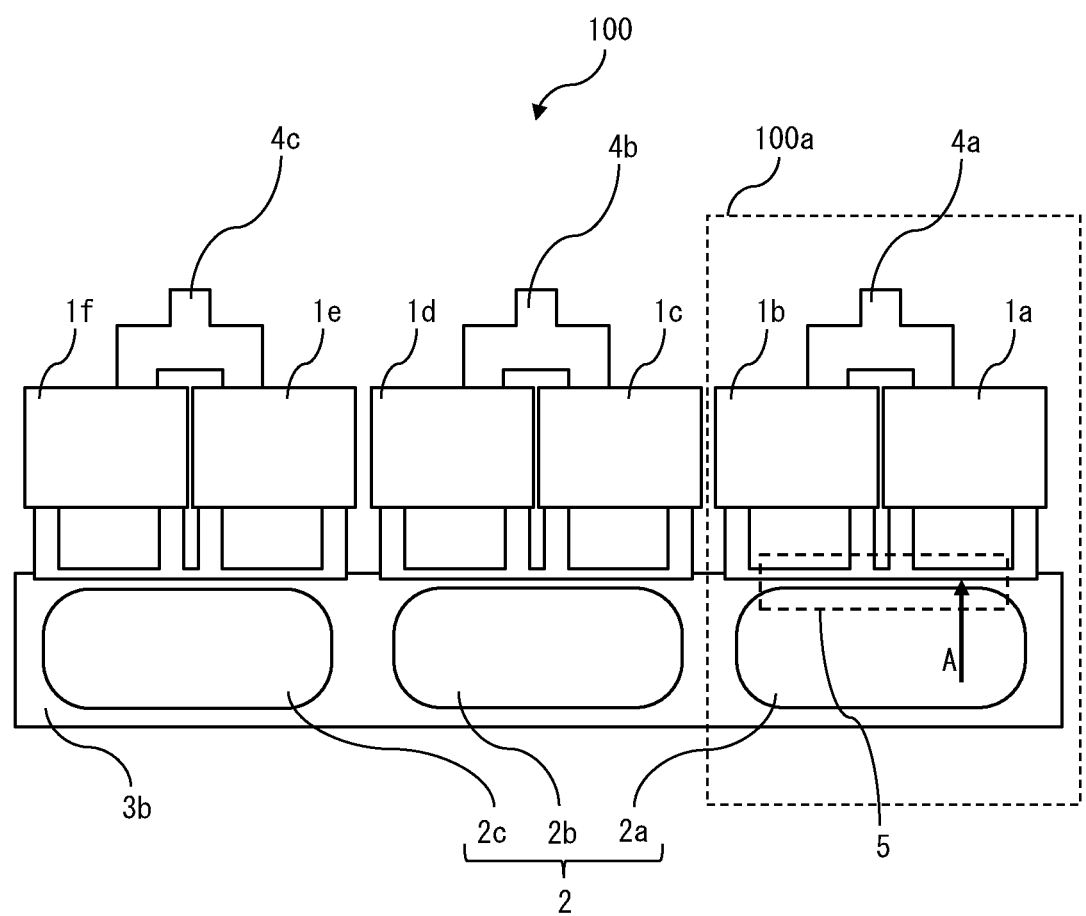
FIG. 3 is a schematic plan view of the power conversion device according to the first embodiment.
Figure 4:
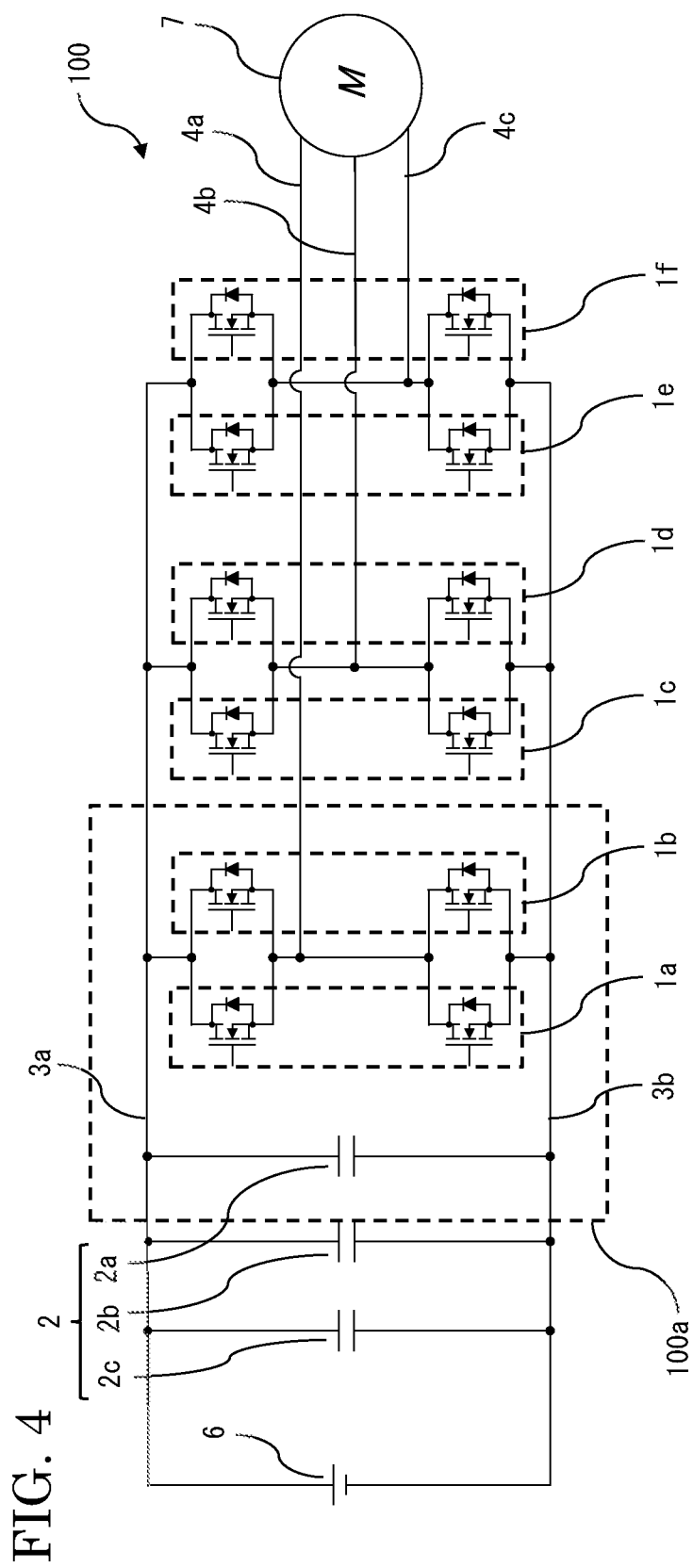
FIG. 4 schematically shows a circuit of the power conversion device according to the first embodiment.
Figure 5:
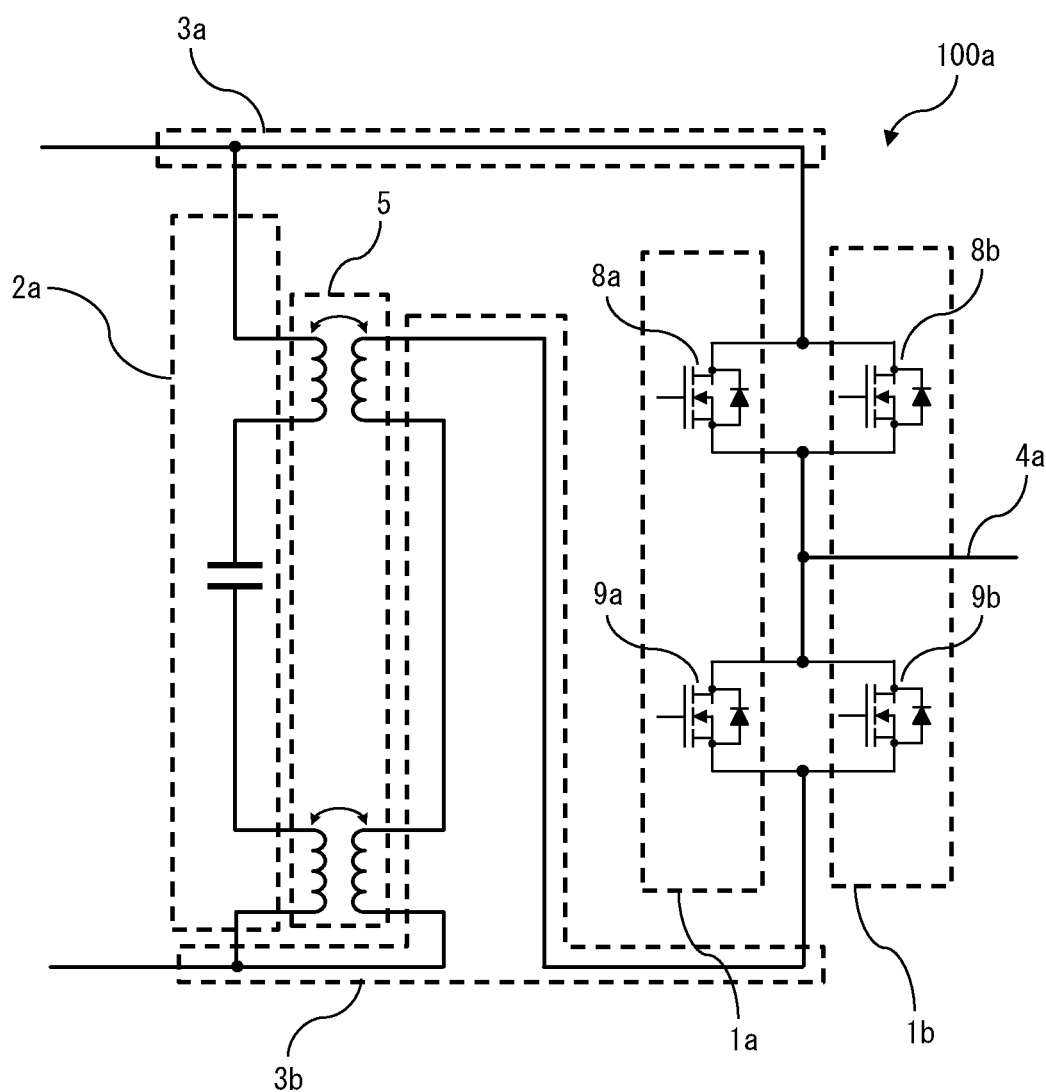
FIG. 5 shows details of the circuit of the power conversion device according to the first embodiment.

FIG. 1 is a schematic perspective view of a power conversion device 100 according to a first embodiment. FIG. 2 is a schematic side view of the power conversion device 100. FIG. 3 is a schematic plan view of the power conversion device 100 from which a first busbar 3a has been excluded. FIG. 4 schematically shows a circuit of the power conversion device 100. FIG. 5 shows details of the circuit of the power conversion device 100. The power conversion device 100 converts input current from DC into AC or from AC into DC, or converts input voltage into different voltage. In the present disclosure, the power conversion device 100 will be described as a three-phase inverter for converting DC power into AC power. However, the power conversion device according to the present disclosure is not limited to a three-phase inverter.

<Power Conversion Device 100>

As shown in FIG. 1, the power conversion device 100 includes power modules 1a to 1f, capacitor elements 2a to 2c, a first busbar 3a, and a second busbar 3b. As shown in FIG. 2, the capacitor element 2a has: an element body portion 2a1; a first electrode 2a2 provided on a first surface of the element body portion 2a1; and a second electrode 2a3 provided on a second surface of the element body portion 2a1 on an opposite side to the first surface. The other capacitor elements 2b and 2c also have the same configuration. In FIG. 2, an electrode provided on the upper surface of the element body portion 2a1 is defined as the first electrode 2a2, and an electrode provided on the lower surface of the element body portion 2a1 is defined as the second electrode 2a3. However, without limitation thereto, the electrode provided on the lower surface may be defined as the first electrode 2a2, and the electrode provided on the upper surface may be defined as the second electrode 2a3. The first busbar 3a connects the first electrode of each of the plurality of capacitor elements 2a to 2c and corresponding ones of the power modules to each other. The second busbar 3b connects the second electrode of each of the plurality of capacitor elements 2a to 2c and corresponding ones of the power modules to each other. Although the power conversion device 100 includes the six power modules 1a, 1b, 1c, 1d, 1e, and 1f in the present embodiment, the number of the power modules is not limited thereto, and may be one or may be more than this.

Although an example in which busbars directly connecting the power modules and the capacitor elements to each other are provided will be described in the present embodiment, the configuration is not limited thereto. The power modules and the capacitor elements only have to be electrically connected to each other when being mounted. Thus, each of the busbars may be provided so as to be separated into a busbar provided on the power module side and a busbar provided on the capacitor element side, as in the configuration of a general power conversion device. In the case where the busbar is provided so as to be divided into busbars on the respective sides, both busbars are electrically connected to each other through, for example, welding or screwing. In the case where the busbar is provided so as to be divided, it becomes easy to handle the power modules and the capacitor elements during manufacturing of the power conversion device, whereby productivity for the power conversion device 100 can be improved.

A schematic configuration of a circuit of the power conversion device 100 will be described with reference to FIG. 4. A smoothing capacitor 2 is formed by the capacitor elements 2a, 2b, and 2c. The smoothing capacitor 2 is connected to a DC power supply 6. The capacitor elements 2a to 2c and the power modules 1a to 1f are connected to each other via the first busbar 3a and the second busbar 3b. Each of the power modules 1a to 1f has semiconductor elements and converts DC power into AC power through switching operations of the semiconductor elements. The AC power is outputted through AC output busbars 4a, 4b, and 4c to a motor 7 which is an inductive load.

If the power conversion device 100 is applied to an electric automobile or a hybrid automobile, the DC power supply 6 is a secondary battery such as a nickel-hydrogen battery or a lithium-ion battery. The voltage of the DC power supply 6 is assumed to be about 200 V to 1000 V. In addition, this power conversion device 100 converts power of the DC power supply 6 and outputs AC power obtained by the conversion to the motor 7 for driving a drive wheel of the electric automobile or the hybrid automobile.

<One Phase 100a>

Configurations in respective three phases that configure the power conversion device 100 according to the present embodiment are the same as one another. Thus, details of the configuration of the circuit of the power conversion device 100 will be described with reference to FIG. 5 on the basis of one phase 100a selected from among the three phases. The power module 1a has semiconductor elements 8a and 9a, and the power module 1b has semiconductor elements 8b and 9b. Inside each of the power modules, a high-side arm and a low-side arm are formed by the semiconductor elements. Each of the semiconductor elements 8a and 8b is a semiconductor element in the high-side arm, and each of the semiconductor elements 9a and 9b is a semiconductor element in the low-side arm. The high-side arm of the power module 1a and the high-side arm of the power module 1b compose a pair and are simultaneously operated. The low-side arm of the power module 1a and the low-side arm of the power module 1b compose a pair and are simultaneously operated.

Each of the power modules 1a and 1b outputs AC power to the same node through the AC output busbar 4a. In this manner, the power module 1a and the power module 1b compose a pair constituting the one phase 100a of the three-phase inverter. In the present embodiment, the power modules 1a and 1b have a structure obtained by sealing with a mold resin. The structure of the power modules 1a and 1b is not limited thereto, and a structure may be employed in which: the semiconductor elements are accommodated in a case or the like; and the inside of the case is sealed with gel or the like. In addition, although the present embodiment employs a structure in which two power modules are provided per phase in order to output large power, the number of the power modules to be provided for one phase may be changed according to target output power.

<Semiconductor Elements>

Drain terminals of the semiconductor elements 8a and 8b are electrically connected to the first busbar 3a, and source terminals of the semiconductor elements 8a and 8b are electrically connected to the AC output busbar 4a. Drain terminals of the semiconductor elements 9a and 9b are electrically connected to the AC output busbar 4a, and source terminals of the semiconductor elements 9a and 9b are electrically connected to the second busbar 3b.

As each of the semiconductor elements, a power control semiconductor element such as a metal-oxide-semiconductor field-effect transistor (MOSFET) or an insulated-gate bipolar transistor (IGBT), a flyback diode, or the like is used. The semiconductor element is not limited thereto and may be another semiconductor element such as a bipolar transistor. The present embodiment employs a configuration in which: a MOSFET is used; and a parasitic diode of the MOSFET is used as a flyback diode. However, in a case where, for example, a switching element having no parasitic diode such as an IGBT is used, a configuration in which a flyback diode is provided in parallel to the switching element may be employed.

The semiconductor element is formed on a semiconductor substrate formed from a material such as silicon, silicon carbide, or gallium nitride. For the semiconductor element, a wide bandgap semiconductor having a wider bandgap than silicon may be used. In a case where a MOSFET formed from silicon carbide which is a wide bandgap semiconductor, or the like is used, a temporal change amount di/dt of current generated upon switching can be made larger than that of a MOSFET formed from silicon.

Surge voltage which is a problem to be addressed in the present disclosure increases when the temporal change amount di/dt of current generated upon switching is large, i.e., when the switching speed is high. The power conversion device 100 sometimes performs high-speed operation such that the maximum di/dt in a leg exceeds 30 kA/µs. Therefore, the significance of advantageous effects of the present disclosure is more prominently exhibited by applying the configuration in the present disclosure (described later) to the power conversion device 100 which performs high-speed operation and in which wide bandgap semiconductors are used.

<Arrangement of Capacitor Elements and Power Modules>

Arrangement of the capacitor elements and the power modules will be described. In the present embodiment, the first electrode 2a2 is defined as a positive electrode, the second electrode 2a3 is defined as a negative electrode, the first busbar 3a connected to the first electrode 2a2 is defined as a positive-electrode busbar, and the second busbar 3b connected to the second electrode 2a3 is defined as a negative-electrode busbar.

Each of the power modules is disposed so as to be opposed to a side surface of the element body portion of only one of the capacitor elements. In the present embodiment, the power conversion device 100 includes a plurality of the power modules, and each of the plurality of power modules is disposed so as to be opposed to the side surface of the element body portion of only one of the capacitor elements which are set so as to correspond to the plurality of power modules. Specifically, the power module 1a is disposed so as to be opposed only to a side surface of the element body portion of the capacitor element 2a, and the power module 1b is disposed so as to be opposed only to the side surface of the element body portion of the capacitor element 2a. The power module 1c is disposed so as to be opposed only to a side surface of the element body portion of the capacitor element 2b, and the power module 1d is disposed so as to be opposed only to the side surface of the element body portion of the capacitor element 2b. The power module 1e is disposed so as to be opposed only to a side surface of the element body portion of the capacitor element 2c, and the power module 1f is disposed so as to be opposed only to the side surface of the element body portion of the capacitor element 2c.

In the present embodiment, a plurality of the power modules connected in parallel are provided, and the plurality of power modules connected in parallel are disposed so as to be opposed to the side surface of the element body portion of only one of the capacitor elements. Specifically, the power modules 1a and 1b constituting the one phase 100a of the inverter are the plurality of power modules connected in parallel, and the power modules 1a and 1b are disposed so as to be opposed only to the side surface of the element body portion of the capacitor element 2a.

In the present embodiment, the element body portion of each of the plurality of capacitor elements is formed in the shape of a solid tube having a short-side direction and a long-side direction as seen in a direction from the first electrode toward the second electrode, and the corresponding power modules are disposed so as to be opposed to a side surface, of the element body portion, that extends in the long-side direction. With this configuration, the width of the power conversion device 100 can be shortened so that the power conversion device 100 can be downsized, in the short-side direction.

In the present embodiment, the plurality of capacitor elements are disposed side by side in the long-side direction.

With this configuration, the width of the power conversion device 100 can be shortened so that the power conversion device 100 can be downsized, in the short-side direction. The width of a side surface, of the element body portion 2a1, that extends in the long-side direction is set to be approximately equal to a width obtained by summing the lengths of side surfaces of the power modules 1a and 1b.

<Arrangement of Capacitor Elements and Busbars>

Arrangement of the capacitor elements and the busbars will be described. One or each of the first busbar 3a and the second busbar 3b has, as a connection member connecting the power module and a corresponding one of the first electrode or the second electrode to each other, an opposed plate-shape portion opposed only to an opposed portion of the side surface of the element body portion opposed to the power module. In FIG. 2, the second busbar 3b has an opposed plate-shape portion 3b1 opposed only to an opposed portion of the side surface of the element body portion 2a1 opposed to the power module 1a. In the present embodiment, the opposed plate-shape portion 3b1 is provided to the second busbar 3b. However, without limitation thereto, the first busbar 3a and the second busbar 3b may be exchanged in terms of the arrangement thereof to obtain a configuration in which the opposed plate-shape portion is provided to the first busbar 3a. Alternatively, opposed plate-shape portions may be provided to both the first busbar 3a and the second busbar 3b, with the power module 1a being disposed so as to be opposed to the center of the side surface of the element body portion 2a1.

A region 5 enclosed by a broken line shown in FIG. 2 is a region in which the capacitor element 2a and the opposed plate-shape portion 3b1 of the second busbar 3b are magnetically coupled. With this configuration, influence of a mutual inductance that the opposed plate-shape portion 3b1 of the second busbar 3b receives from the capacitor element 2a in the region 5 becomes even. Since influence of the mutual inductance becomes even, current flowing through the second busbar 3b is prevented from becoming uneven inside the second busbar 3b. Thus, current flows evenly inside the second busbar 3b. Since current flows evenly inside the second busbar 3b, the self-inductance of the second busbar 3b is decreased as compared to a case where current is uneven inside the second busbar 3b. Since the self-inductance of the second busbar 3b is decreased, the path inductance of the second busbar 3b can be decreased.

In addition, since current flows evenly inside the second busbar 3b, a loss generated according to the resistance of the second busbar 3b is decreased as compared to the case where current is uneven inside the second busbar 3b. In addition, the directions of currents flowing through the capacitor element 2a and the second busbar 3b upon occurrence of a surge are opposite to each other, and thus the path inductance can be further decreased owing to influence of the mutual inductance. By employing the configuration in the present disclosure in this manner, the path inductance can be decreased, and the loss in the busbar can be decreased. In addition, the opposed plate-shape portion 3b1 can easily be formed by bending the second busbar 3b, and thus cost for the power conversion device 100 can be decreased.

Decrease in the path inductance leads to decrease in an electromotive voltage $\Delta V$ which is generated according to an inductance L and the temporal change amount di/dt of current generated upon switching of each semiconductor element and which is expressed as $\Delta V = L \times di/dt$. In designing the power conversion device 100, the temporal change amount di/dt of current is set so as not to allow a voltage higher than the withstand voltage of a semiconductor element to be applied to the element owing to influence of the electromotive voltage $\Delta V$. In the configuration in the present disclosure, the inductance L is low, and thus the temporal change amount di/dt of current can be set to be large. A switching loss that occurs upon switching of a semiconductor element is in a trade-off relationship with di/dt. That is, a larger di/dt leads to a lower switching loss, and a smaller di/dt leads to a higher switching loss. Therefore, employment of the configuration in the present disclosure makes it possible to, since the path inductance is low, select an inexpensive semiconductor element having low withstand voltage without the need for using any expensive semiconductor element having high withstand voltage. Consequently, cost for the power conversion device 100 can be decreased. Further, since evenness is attained in the current path and the loss in the second busbar 3b is decreased, it is unnecessary to employ any additional cooling structure for cooling the second busbar, whereby the power conversion device 100 can be downsized.

If, as in the present embodiment, the power conversion device 100 includes a plurality of the power modules and each of the plurality of power modules is disposed so as to be opposed to the side surface of the element body portion of only one of the capacitor elements which are set so as to correspond to the plurality of power modules, the path inductance of each of the busbars connected to the plurality of power modules can be decreased. In addition, if, as in the present embodiment, a plurality of the power modules connected in parallel are provided and the plurality of power modules connected in parallel are disposed so as to be opposed to the side surface of the element body portion of only one of the capacitor elements, the path inductance in the power conversion device 100 can easily be decreased even with increase in the output of the power conversion device 100 due to the plurality of power modules.

In the present embodiment, the capacitor elements 2a to 2c are film capacitors. Film capacitors experience low losses and thus generate little heat. This eliminates the need for providing any additional cooler for cooling the capacitor elements. Further, film capacitors have high rated voltages and thus are suitable as smoothing capacitors for use in a power conversion device in which wide bandgap semiconductors required to be operated at high voltage are used. Therefore, if film capacitors are used as the capacitor elements 2a to 2c, the significance of the advantageous effects of the present disclosure is more prominently exhibited.

<Resin Member 20>

Figure 12:
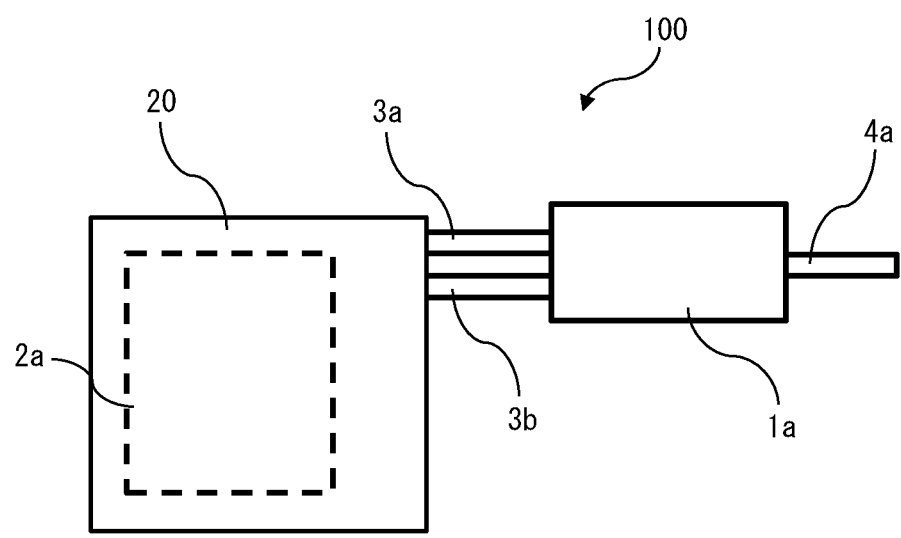
FIG. 12 is a schematic side view of another power conversion device according to the first embodiment.

Another power conversion device 100 according to the first embodiment will be described. FIG. 12 is a schematic side view of the other power conversion device 100 according to the first embodiment. The capacitor element 2a opposed to the power module 1a, the first busbar 3a, and the second busbar 3b are sealed with a resin member 20. The plurality of capacitor elements may all be sealed collectively or may be sealed individually. In particular, if the capacitor elements are film capacitors, the capacitor element 2a, the first busbar 3a, and the second busbar 3b are used in a state of being sealed with the resin member 20 as shown in FIG. 12. If the power conversion device 100 is applied to an electric automobile or a hybrid automobile, the power conversion device 100 needs to endure vibrations caused by traveling of the automobile or the like. With this configuration, deformation of the power conversion device 100 due to vibrations or the like is suppressed. Thus, the distance between the capacitor element 2a and the opposed plate-shape portion 3b1 of the second busbar 3b is not changed, whereby the advantageous effects of the present disclosure are not lost.

The configuration shown in FIG. 12 is a configuration in which the capacitor elements 2a, 2b, and 2c, the first busbar 3a, and the second busbar 3b are sealed with the resin member 20 so as to be treated as one component. Without limitation to this configuration, the first busbar 3a and the second busbar 3b may be divided correspondingly to the number of the capacitor elements so that the component obtained by sealing with the resin member 20 is divided into a plurality of portions. Even by division into a plurality of portions, deformation of the power conversion device 100 due to vibrations can be suppressed in the same manner, whereby the advantageous effects of the present disclosure are not lost.

Figure 13:
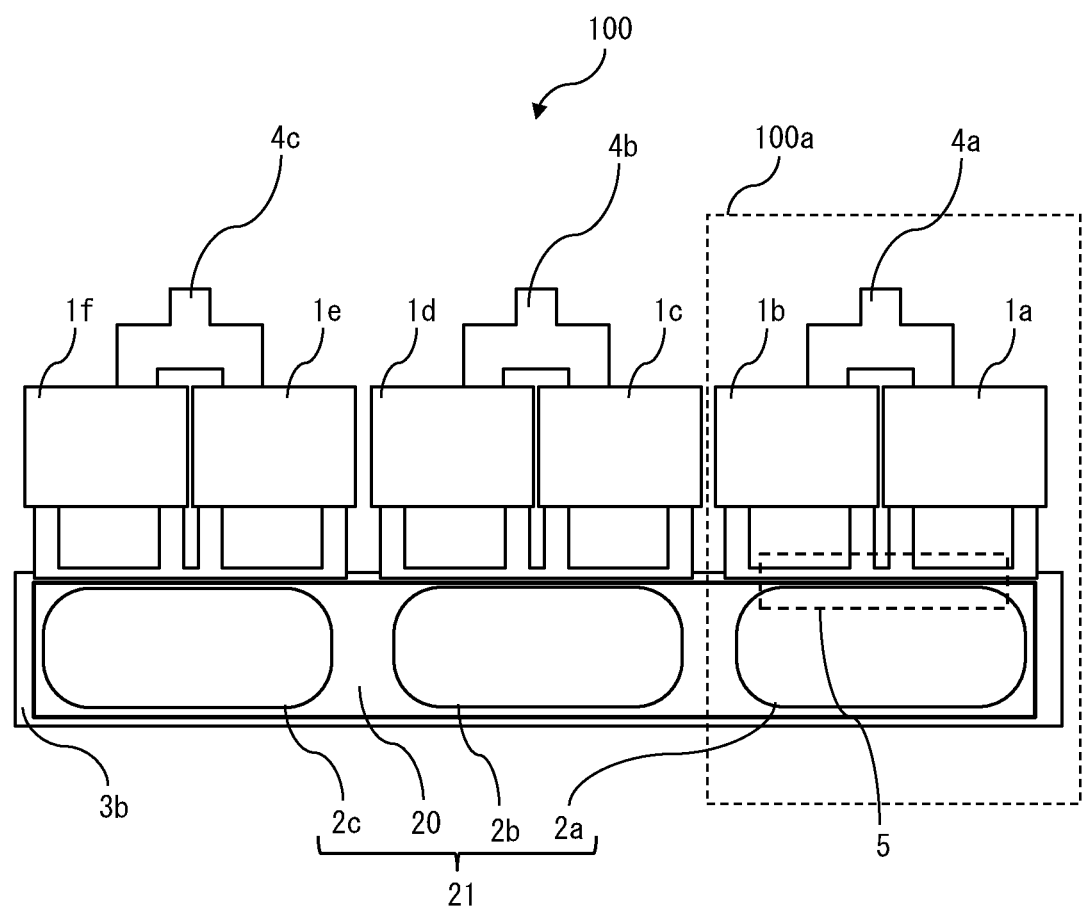
FIG. 13 is a schematic plan view of another power conversion device according to the first embodiment.

Another power conversion device 100 according to the first embodiment will be described. FIG. 13 is a schematic plan view of the other power conversion device 100 according to the first embodiment from which the first busbar 3a has been excluded. The plurality of capacitor elements 2a, 2b, and 2c are sealed with the resin member 20 so as to form a smoothing capacitor module 21. With this configuration, all the plurality of capacitor elements 2a, 2b, and 2c are sealed in the same resin member 20. Thus, the group of capacitor elements and the busbars are integrated to be treated as one component, whereby the power conversion device 100 can be downsized.

Comparative Example

Figure 6:
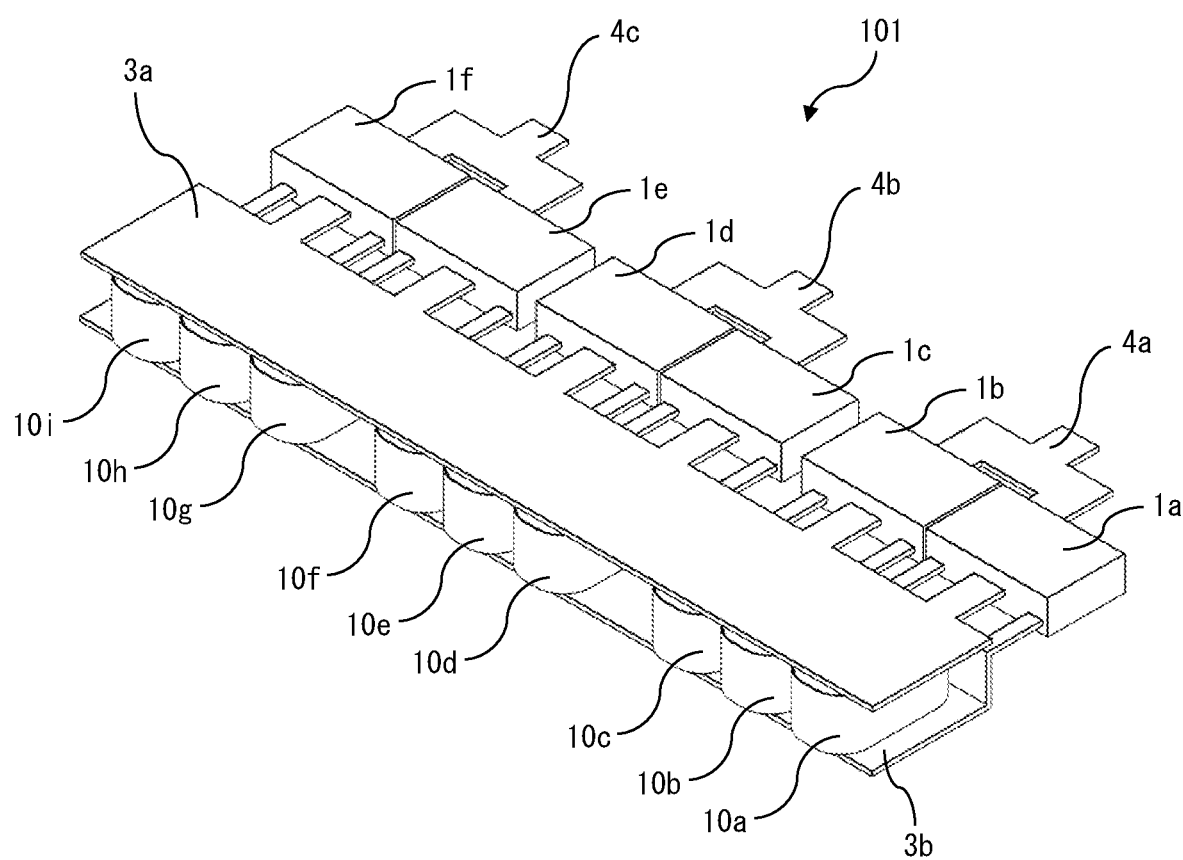
FIG. 6 is a schematic perspective view of a power conversion device in a comparative example.
Figure 7:
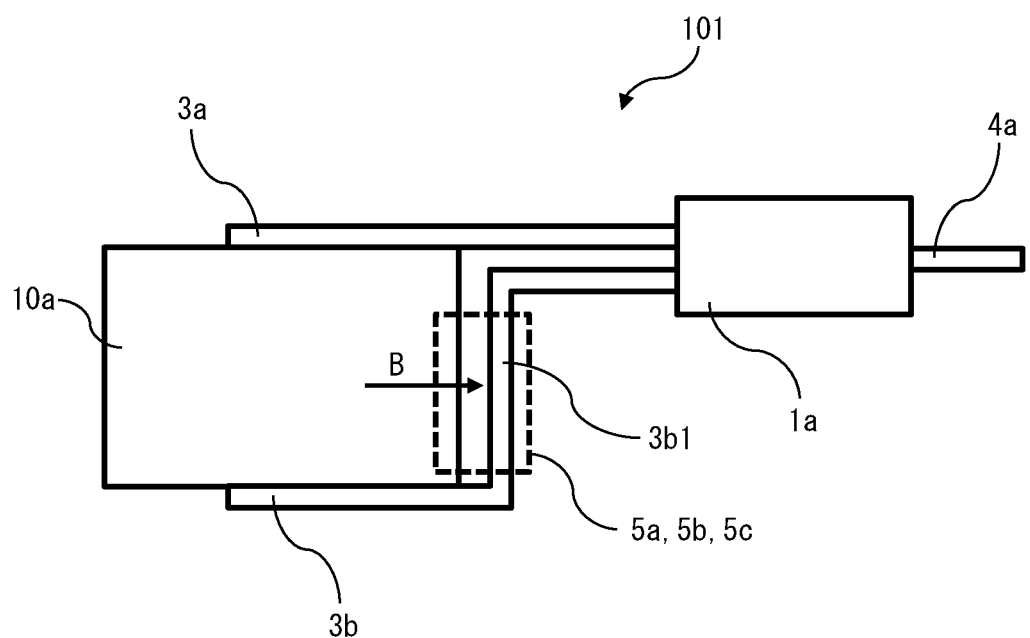
FIG. 7 is a schematic side view of the power conversion device in the comparative example.
Figure 8:
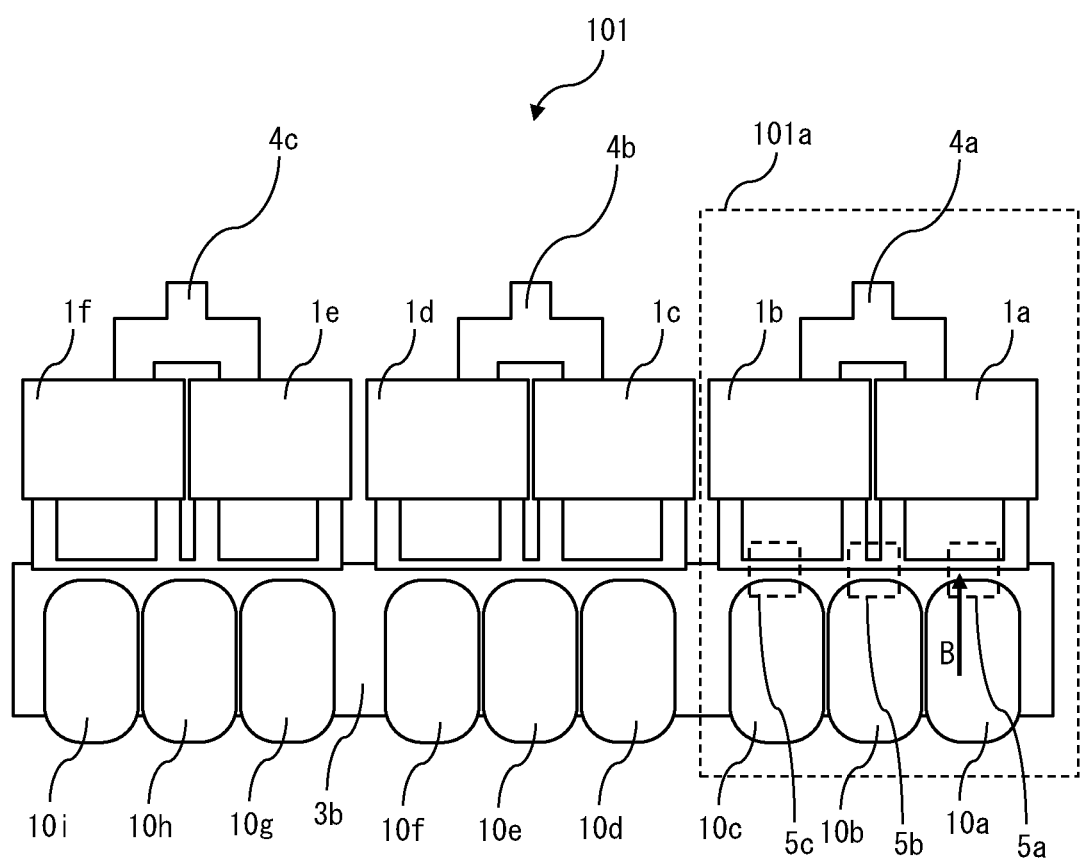
FIG. 8 is a schematic plan view of the power conversion device in the comparative example.

The advantageous effects of the present disclosure will be further described through comparison with a comparative example. FIG. 6 is a schematic perspective view of a power conversion device 101 in the comparative example. FIG. 7 is a schematic side view of the power conversion device 101 in the comparative example. FIG. 8 is a schematic plan view of the power conversion device 101 in the comparative example from which the first busbar 3a has been excluded. In FIG. 7, electrodes of a capacitor element 10a are not shown. FIG. 6, FIG. 7, and FIG. 8 respectively correspond to FIG. 1, FIG. 2, and FIG. 3 showing the power conversion device 100 according to the present embodiment.

The power conversion device 101 has a configuration in which the number of capacitor elements is different from that in the power conversion device 100. In the power conversion device 101, the capacitor element 2a of the power conversion device 100 is composed of three capacitor elements 10a, 10b, and 10c. Likewise, the capacitor element 2b is composed of capacitor elements 10d, 10e, and 10f, and the capacitor element 2c is composed of capacitor elements 10g, 10h, and 10i. In the comparative example, each of the power modules is not disposed so as to be opposed to the side surface of the element body portion of only one of the capacitor elements. Therefore, although the number of the regions 5 in the one phase 100a is one in FIG. 3, one phase 101a is provided with three regions 5 which are regions 5a, 5b, and 5c enclosed by broken lines as shown in FIG. 8.

Figure 9:
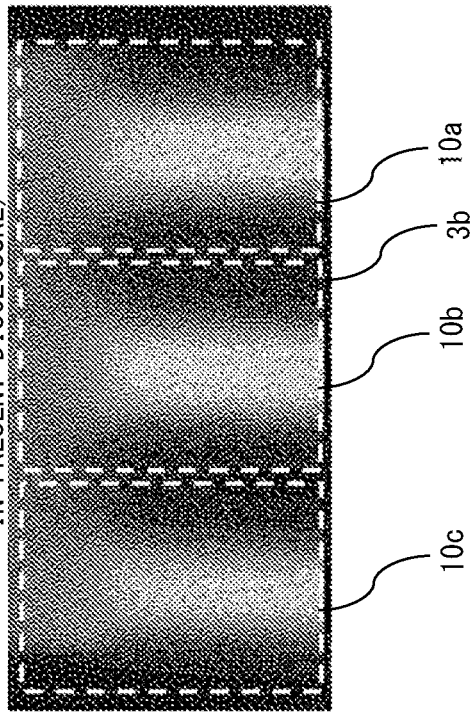
FIG. 9 is a diagram for explaining advantageous effects of the power conversion device according to the first embodiment.
Figure 9:
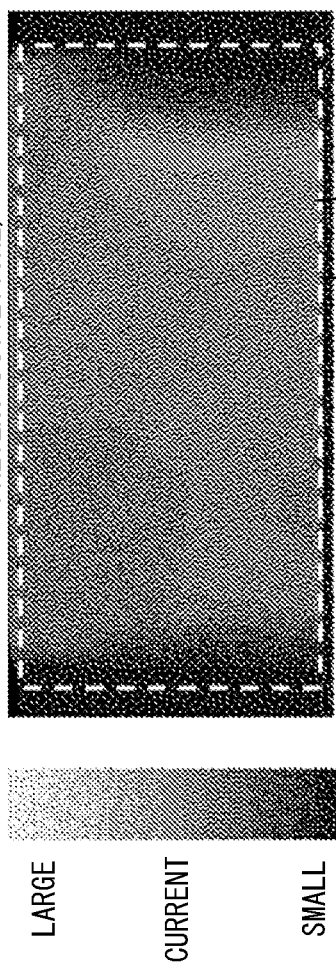

Comparison with the comparative example will be described with reference to FIG. 9. FIG. 9 is a diagram for explaining the advantageous effects of the power conversion device 100 and is a contour diagram showing current distributions in the second busbar 3b as seen in the direction of arrow A shown in FIG. 2 and FIG. 3 and a second busbar 3b as seen in the direction of arrow B shown in FIG. 7 and FIG. 8. Broken lines shown in the drawing indicate the positions of the capacitor elements opposed to the second busbars 3b. In the case of employing the configuration in the present disclosure, influence of the mutual inductance received by the second busbar 3b from the capacitor element 2a is even, and thus the current distribution in the second busbar 3b is also even, as shown on the left side of FIG. 9.

Meanwhile, in the comparative example in which the configuration in the present disclosure is not employed, mutual inductances received by the second busbar 3b from the capacitor elements 10a, 10b, and 10c are unevenly distributed in the regions 5a, 5b, and 5c, respectively. Therefore, the path inductance decreases at the locations of the regions 5a, 5b, and 5c. As a result, current is distributed so as to be concentrated on locations along the respective regions 5a, 5b, and 5c as shown on the right side of FIG. 9. In this manner, the actual width of the current path of the second busbar 3b differs between the present embodiment and the comparative example, and the self-inductance of the second busbar 3b is lower in the present embodiment in which the current path of the second busbar 3b is wider. Since the self-inductance of the second busbar 3b is decreased and current is not locally concentrated on a portion of the second busbar 3b, the loss in the second busbar 3b is decreased. Local heat generation at current concentration portions of the second busbar 3b in the respective regions 5a, 5b, and 5c in the comparative example does not occur in the second busbar 3b in the present embodiment.

Figure 10:
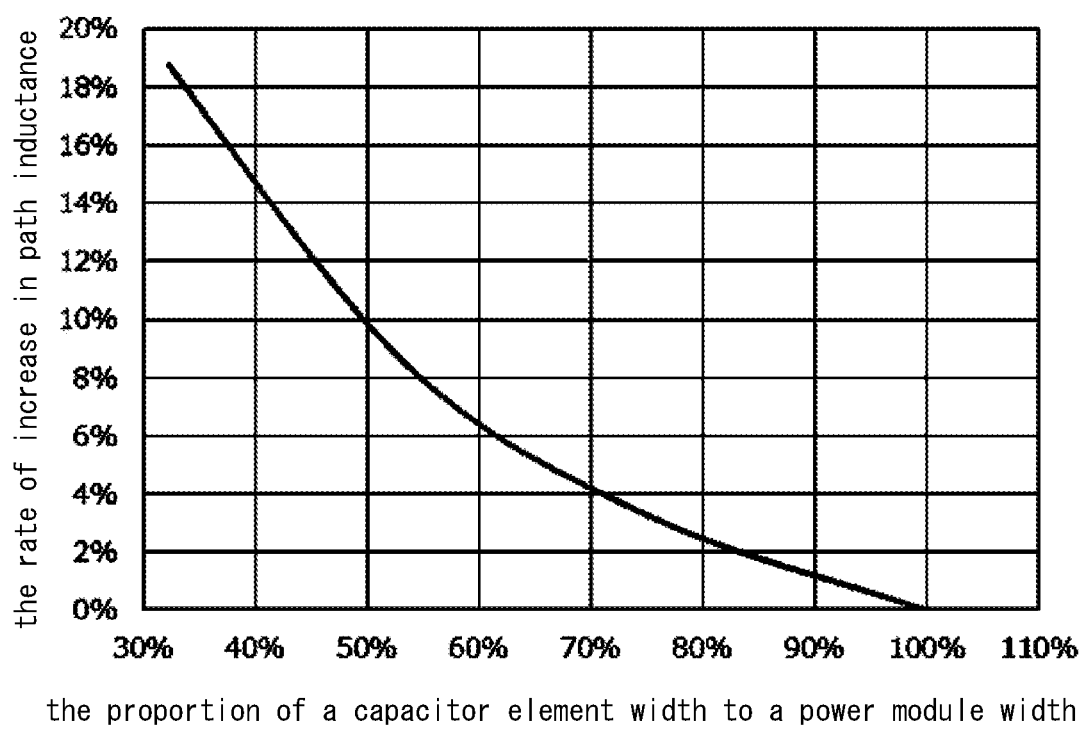
FIG. 10 shows the rate of increase in path inductance, with respect to the proportion of a capacitor element width to a power module width.

In the configuration in the present disclosure, the path inductance is decreased in the region 5 owing to influence of the mutual inductance generated between the capacitor element 2a and the second busbar 3b. Therefore, the width of the surface, of the capacitor element 2a, that is opposed to the power modules 1a and 1b is desirably large in the region 5. FIG. 10 shows the rate of increase in path inductance, with respect to the proportion of a capacitor element width to a power module width. Regarding the proportion of the capacitor element width to the power module width in the horizontal axis, a proportion at which the capacitor element width is equal to the power module width is defined as 100%. In the present embodiment, the power module width is the total width of the two power modules (power modules 1a and 1b).

Judging from FIG. 10, the slope of the rate of increase in path inductance becomes steep when the proportion of the width of the capacitor element 2a becomes equal to or lower than 60%. Therefore, the proportion of the width of the capacitor element 2a needs to be set to be equal to or higher than 60%. In the present embodiment, the width of the side surface, of the capacitor element, that extends in the long-side direction is set to be approximately equal to a width obtained by summing the lengths of the power modules 1a and 1b, in order to obtain a sufficient advantageous effect of decreasing the path inductance while downsizing the power conversion device 100.

Figure 11:
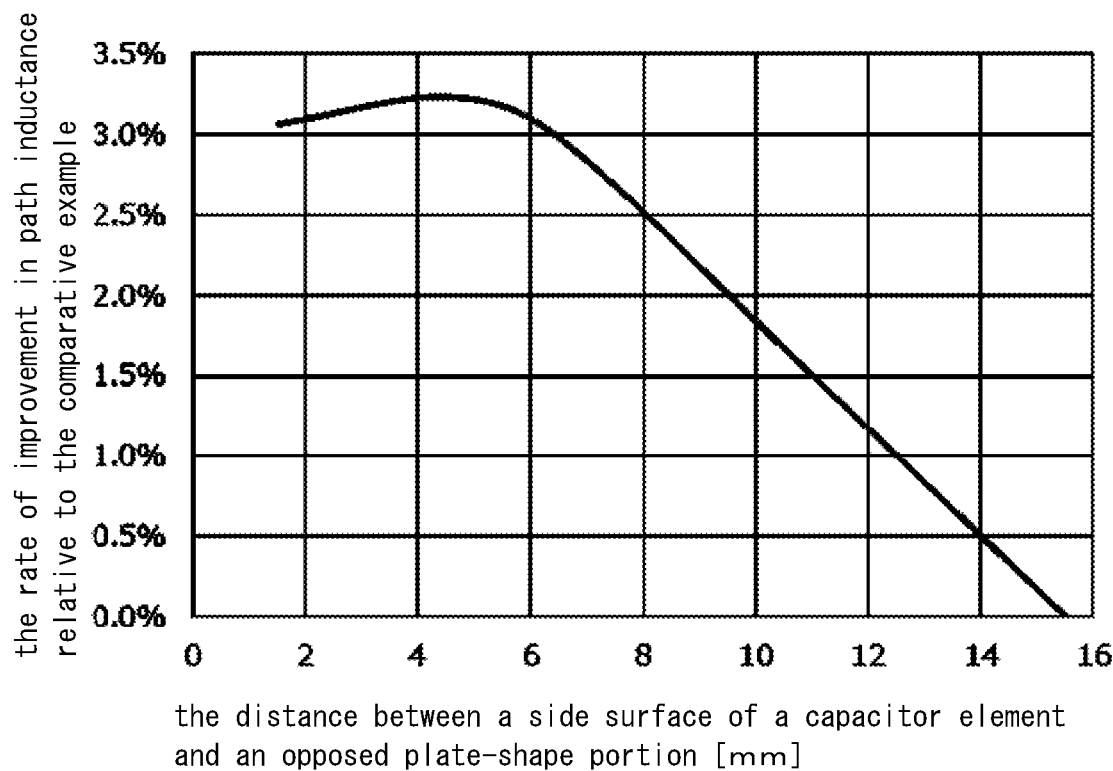
FIG. 11 shows the rate of improvement in path inductance relative to the comparative example, with respect to the distance between a side surface of a capacitor element and an opposed plate-shape portion.

In addition, a shorter distance between the element body portion 2a1 of the capacitor element 2a and the opposed plate-shape portion 3b1 of the second busbar 3b in the region leads to a more significant influence of the mutual inductance between the capacitor element 2a and the second busbar 3b and thus leads to more prominent exhibition of the advantageous effects of the present disclosure. FIG. 11 shows the rate of improvement in path inductance relative to the comparative example, with respect to the distance between the side surface of the element body portion of the capacitor element and the opposed plate-shape portion.

Judging from FIG. 11, it is known that the advantageous effects of the present disclosure are obtained when this distance is equal to or shorter than 15 mm. The reason is as follows. That is, the advantageous effects of the present disclosure are obtained as a result of decreasing the path inductance owing to influence of the mutual inductance by utilizing magnetic coupling between the second busbar 3b and the capacitor element 2a, and thus a longer distance to a target object leads to a greater decrease in the effect of influence of the mutual inductance. In the present embodiment, the distance between the side surface of the element body portion of the capacitor element and the opposed plate-shape portion is equal to or shorter than 15 mm. With this configuration, the path inductance can be effectively decreased owing to influence of the mutual inductance by utilizing magnetic coupling between the second busbar 3b and the capacitor element 2a.

If there is a possibility that the busbar comes into contact with the capacitor element by being deformed owing to vibrations or the like, this distance needs to be sufficiently ensured within the range of not longer than 15 mm so as not to allow contact between the busbar and the capacitor element. However, if the capacitor element 2a and the second busbar 3b are sealed with the resin member, there is no concern that the busbar comes into contact with the capacitor element by being deformed owing to vibrations or the like. Therefore, it is desirable to employ a configuration in which this distance is shortened to be equal to or shorter than 3 mm so that the advantageous effects of the present disclosure are maximally exhibited.

<Modification>

Figure 14:
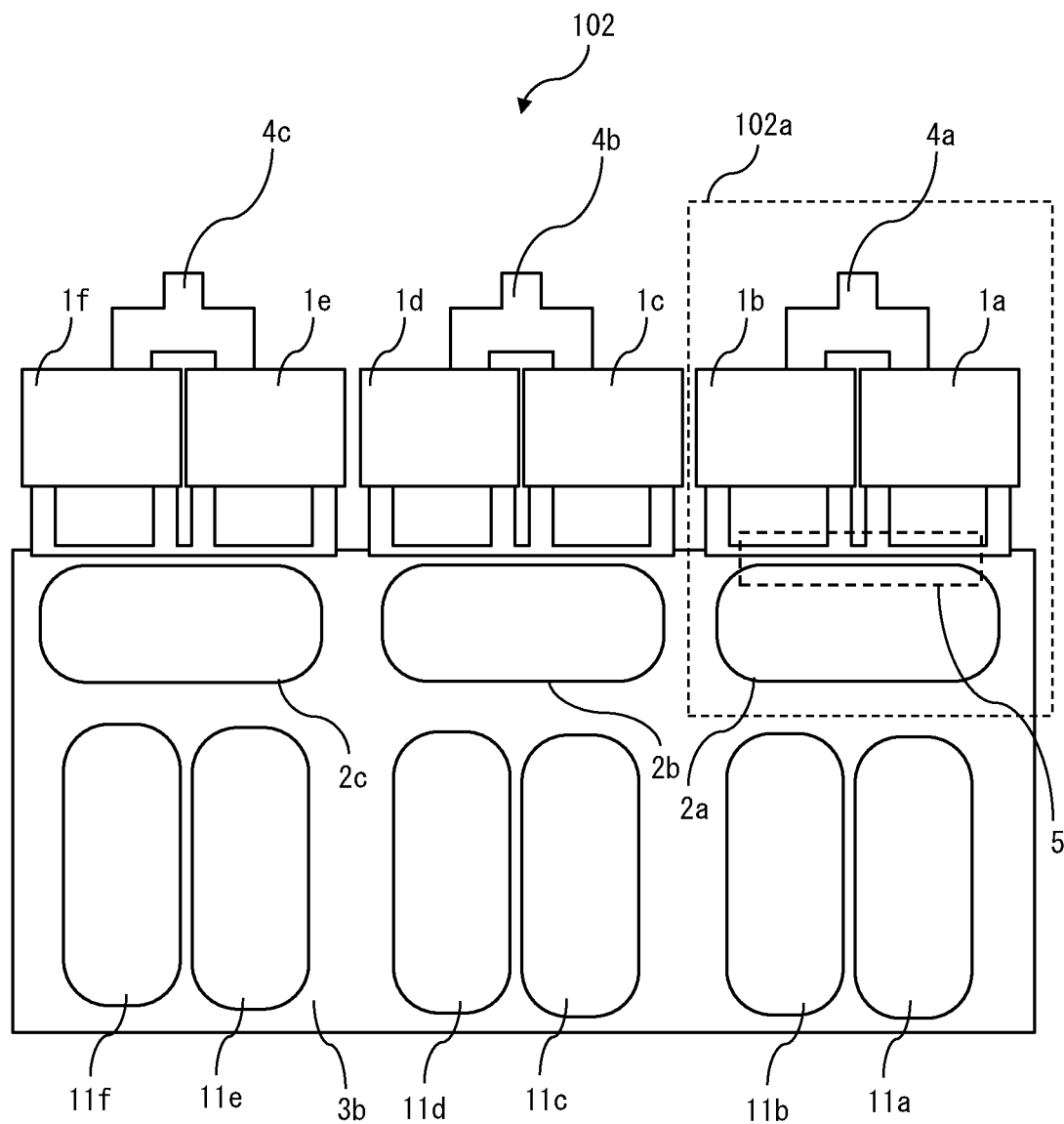
FIG. 14 is a schematic plan view of another power conversion device according to the first embodiment.

A modification of the power conversion device 100 according to the first embodiment will be described. FIG. 14 is a schematic plan view of a power conversion device 102 which is another power conversion device according to the first embodiment and from which the first busbar 3a has been excluded. The power conversion device 102 has a configuration obtained by providing capacitor elements 11a to 11f as additional capacitor elements to the power conversion device 100.

A dominant capacitor element that contributes to the path inductance in one phase 102a of the power conversion device 102 upon occurrence of a surge is the capacitor element 2a. Thus, if the capacitance of the capacitor element 2a needs to be increased in order to reduce pulsation of power, the additional capacitor elements 11a to 11f for ensuring the capacitance of the capacitor element 2a may be disposed electrically in parallel to the capacitor element 2a as shown in FIG. 14. In this manner, there is a degree of freedom in the arrangement of the capacitor elements 11a to 11f, and thus the capacitor element 2a which contributes to the path inductance can be optimally positioned. Consequently, the significance of the advantageous effects of the present disclosure is more prominently exhibited. It is noted that the arrangement of the additional capacitor elements shown in FIG. 14 is merely an example, and the positions and the orientations of the additional capacitor elements are not particularly limited. Further, the number of the capacitor elements to be added may be changed according to a necessary capacitance.

As described above, in the power conversion device 100 according to the first embodiment, the power module 1a is disposed so as to be opposed to the side surface of the element body portion 2a1 of only one of the capacitor elements, i.e., the capacitor element 2a, and the second busbar 3b has the opposed plate-shape portion 3b1 opposed only to the opposed portion of the side surface of the element body portion 2a1 opposed to the power module 1a. Consequently, influence of the mutual inductance on the second busbar 3b becomes even, and current flows evenly inside the second busbar 3b. Therefore, the self-inductance of the second busbar 3b is decreased, whereby the path inductance of the second busbar 3b can be decreased. The opposed plate-shape portion 3b1 can easily be formed by bending the second busbar 3b, whereby cost for the power conversion device 100 can be decreased. In addition, evenness is attained in the current path, and the loss in the second busbar 3b is decreased. Thus, it is unnecessary to employ any additional cooling structure for cooling the second busbar, whereby the power conversion device 100 can be downsized.

If the power conversion device 100 includes a plurality of the power modules and each of the plurality of power modules is disposed so as to be opposed to the side surface of the element body portion of only one of the capacitor elements which are set so as to correspond to the plurality of power modules, the path inductances of the busbars connected to the plurality of power modules can be decreased. In addition, if a plurality of the power modules connected in parallel are provided and the plurality of power modules connected in parallel are disposed so as to be opposed to the side surface of the element body portion of only one of the capacitor elements, the path inductance in the power conversion device 100 can easily be decreased even with increase in the output of the power conversion device 100 due to the plurality of power modules.

If the distance between the side surface of the element body portion and the opposed plate-shape portion is equal to or shorter than 15 mm, the path inductance can be effectively decreased owing to influence of the mutual inductance by utilizing magnetic coupling between the busbar having the opposed plate-shape portion and the capacitor element. In addition, if the element body portion of each of the plurality of capacitor elements is formed in the shape of a solid tube having a short-side direction and a long-side direction as seen in a direction from the first electrode toward the second electrode, and the power module is disposed so as to be opposed to the side surface, of the element body portion, that extends in the long-side direction, the width of the power conversion device 100 can be shortened so that the power conversion device 100 can be downsized, in the short-side direction. In addition, if the plurality of capacitor elements are disposed side by side in the long-side direction, the width of the power conversion device 100 can be shortened so that the power conversion device 100 can be downsized, in the short-side direction.

If each of the semiconductor elements of the power modules is a wide bandgap semiconductor in which the temporal change amount di/dt of current is large, since the path inductance has been decreased in the configuration in the present disclosure so that the electromotive voltage can be decreased, a wide bandgap semiconductor can be used without considering any element withstand voltage, and the power conversion device 100 can be operated at high speed. In addition, if the capacitor elements are film capacitors, since film capacitors experience low losses and generate little heat and thus eliminate the need for providing any additional cooler for cooling the capacitor elements, the power conversion device 100 can be downsized.

If the capacitor element opposed to the power module, the first busbar, and the second busbar are sealed with the resin member 20, deformation of the power conversion device 100 due to vibrations or the like is suppressed. Consequently, the distance between the capacitor element and the opposed plate-shape portion is not changed, whereby the advantageous effect of decreasing the path inductance can be maintained. In addition, if the plurality of capacitor elements are sealed with the resin member 20 so as to form the smoothing capacitor module 21, since all the plurality of capacitor elements are sealed in the same resin member 20, the group of capacitor elements and the busbars can be integrated to be treated as one component, whereby the power conversion device 100 can be downsized.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

(Additional Note 1)

A power conversion device including:
a power module;
a plurality of capacitor elements each having an element body portion, a first electrode provided on a first surface of the element body portion, and a second electrode provided on a second surface of the element body portion on an opposite side to the first surface;
a first busbar connecting the first electrode of each of the plurality of capacitor elements and the power module to each other; and
a second busbar connecting the second electrode of each of the plurality of capacitor elements and the power module to each other, wherein
the power module is disposed so as to be opposed to a side surface of the element body portion of only one of the capacitor elements, and
one or each of the first busbar and the second busbar has, as a connection member connecting the power module and a corresponding one of the first electrode or the second electrode to each other, an opposed plate-shape portion opposed only to an opposed portion of the side surface of the element body portion opposed to the power module.

(Additional Note 2)

The power conversion device according to additional note 1, including a plurality of the power modules, wherein
each of the plurality of power modules is disposed so as to be opposed to the side surface of the element body portion of only one of the capacitor elements which are set so as to correspond to the plurality of power modules.

(Additional Note 3)

The power conversion device according to additional note 1, including a plurality of the power modules connected in parallel, wherein
the plurality of power modules connected in parallel are disposed so as to be opposed to the side surface of the element body portion of only one of the capacitor elements.

(Additional Note 4)

The power conversion device according to any one of additional notes 1 to 3, wherein
a distance between the side surface of the element body portion and the opposed plate-shape portion is equal to or shorter than 15 mm.

(Additional Note 5)

The power conversion device according to any one of additional notes 1 to 4, wherein
the element body portion of each of the plurality of capacitor elements is formed in a shape of a solid tube having a short-side direction and a long-side direction as seen in a direction from the first electrode toward the second electrode, and
the power module is disposed so as to be opposed to a side surface, of the element body portion, that extends in the long-side direction.

(Additional Note 6)

The power conversion device according to additional note 5, wherein
the plurality of capacitor elements are disposed side by side in the long-side direction.

(Additional Note 7)

The power conversion device according to any one of additional notes 1 to 6, wherein
the power module has a semiconductor element which is a wide bandgap semiconductor.

(Additional Note 8)

The power conversion device according to any one of additional notes 1 to 7, wherein
the capacitor elements are film capacitors.

(Additional Note 9)

The power conversion device according to any one of additional notes 1 to 8, wherein
the capacitor element opposed to the power module, the first busbar, and the second busbar are sealed with a resin member.

(Additional Note 10)

The power conversion device according to any one of additional notes 1 to 9, wherein
the plurality of capacitor elements are sealed with a resin member so as to form a smoothing capacitor module.

DESCRIPTION OF THE REFERENCE CHARACTERS 1a, 1b, 1c, 1d, 1e, 1f power module
2 smoothing capacitor
2a, 2b, 2c capacitor element
2a1 element body portion
2a2 first electrode
2a3 second electrode
3a first busbar
3b second busbar
3b1 opposed plate-shape portion
4a, 4b, 4c AC output busbar
5, 5a, 5b, 5c region
6 DC power supply
7 motor
8a, 8b, 9a, 9b semiconductor element
10a, 10b, 10c, 10d, 10e, 10f, 10g, 10h, 10i, 11a, 11f capacitor element
20 resin member
21 smoothing capacitor module
100 power conversion device
100a one phase
101 power conversion device
101a one phase
102 power conversion device
102a one phase

What is claimed is:

1. A power conversion device comprising:
a power module;
a plurality of capacitor elements each having an element body portion, a first electrode provided on a first surface of the element body portion, and a second electrode provided on a second surface of the element body portion on an opposite side to the first surface;
a first busbar connecting the first electrode of each of the plurality of capacitor elements and the power module to each other; and
a second busbar connecting the second electrode of each of the plurality of capacitor elements and the power module to each other, wherein
the power module is disposed so as to be opposed to a side surface of the element body portion of only one of the capacitor elements, and
one or each of the first busbar and the second busbar has, as a connection member connecting the power module and a corresponding one of the first electrode or the second electrode to each other, an opposed plate-shape portion opposed only to an opposed portion of the side surface of the element body portion opposed to the power module,
wherein each of the first busbar and the second busbar are connected to a side of the power module power module facing the plurality of capacitor elements.

2. The power conversion device according to claim 1, comprising a plurality of the power modules, wherein
each of the plurality of power modules is disposed so as to be opposed to the side surface of the element body portion of only one of the capacitor elements which are set so as to correspond to the plurality of power modules.

3. The power conversion device according to claim 2, wherein
a distance between the side surface of the element body portion and the opposed plate-shape portion is equal to or shorter than 15 mm.

4. The power conversion device according to claim 2, wherein
the element body portion of each of the plurality of capacitor elements is formed in a shape of a solid tube having a short-side direction and a long-side direction as seen in a direction from the first electrode toward the second electrode, and
the power module is disposed so as to be opposed to a side surface, of the element body portion, that extends in the long-side direction.

5. The power conversion device according to claim 4, wherein
the plurality of capacitor elements are disposed side by side in the long-side direction.

6. The power conversion device according to claim 5, wherein
the plurality of capacitor elements are sealed with a resin member so as to form a smoothing capacitor module.

7. The power conversion device according to claim 2, wherein
the power module has a semiconductor element which is a wide bandgap semiconductor.

8. The power conversion device according to claim 2, wherein
the capacitor elements are film capacitors.

9. The power conversion device according to claim 1, comprising a plurality of the power modules connected in parallel, wherein
the plurality of power modules connected in parallel are disposed so as to be opposed to the side surface of the element body portion of only one of the capacitor elements.

10. The power conversion device according to claim 1, wherein
a distance between the side surface of the element body portion and the opposed plate-shape portion is equal to or shorter than 15 mm.

11. The power conversion device according to claim 1, wherein
the element body portion of each of the plurality of capacitor elements is formed in a shape of a solid tube having a short-side direction and a long-side direction as seen in a direction from the first electrode toward the second electrode, and
the power module is disposed so as to be opposed to a side surface, of the element body portion, that extends in the long-side direction.

12. The power conversion device according to claim 11, wherein
the plurality of capacitor elements are disposed side by side in the long-side direction.

13. The power conversion device according to claim 1, wherein
the power module has a semiconductor element which is a wide bandgap semiconductor.

14. The power conversion device according to claim 1, wherein
the capacitor elements are film capacitors.

15. The power conversion device according to claim 1, wherein
the capacitor element opposed to the power module, the first busbar, and the second busbar are sealed with a resin member.

16. The power conversion device according to claim 1, wherein
the plurality of capacitor elements are sealed with a resin member so as to form a smoothing capacitor module.

* * * * *